US008568555B2

(12) United States Patent
Suzuki et al.

(10) Patent No.: US 8,568,555 B2
(45) Date of Patent: Oct. 29, 2013

(54) METHOD AND APPARATUS FOR REDUCING SUBSTRATE TEMPERATURE VARIABILITY

(75) Inventors: Kenji Suzuki, Guilderland, NY (US); Mirko Vukovic, Slingerlands, NY (US)

(73) Assignee: Tokyo Electron Limited, Tokyo (JP)

( * ) Notice: Subject to any disclaimer, the term of this patent is extended or adjusted under 35 U.S.C. 154(b) by 1527 days.

(21) Appl. No.: 11/730,282

(22) Filed: Mar. 30, 2007

(65) Prior Publication Data
US 2008/0241379 A1 Oct. 2, 2008

(51) Int. Cl.
*H01L 21/461* (2006.01)
*C23C 16/00* (2006.01)

(52) U.S. Cl.
USPC ..................... 156/345.34; 118/715

(58) Field of Classification Search
USPC ....................... 118/715; 156/345.34
See application file for complete search history.

(56) References Cited

U.S. PATENT DOCUMENTS

| | | | | |
|---|---|---|---|---|
| 6,143,128 A * | 11/2000 | Ameen et al. | ............ | 156/345.24 |
| 6,319,832 B1 * | 11/2001 | Uhlenbrock et al. | ......... | 438/681 |
| 6,485,603 B1 * | 11/2002 | Yee et al. | ................. | 156/345.45 |
| 6,625,862 B2 * | 9/2003 | Kajiyama et al. | ............... | 29/458 |
| 6,863,077 B2 * | 3/2005 | Sun et al. | ........................ | 134/1.1 |
| 7,357,175 B2 * | 4/2008 | Bader | ............................ | 165/133 |
| 2001/0015074 A1 * | 8/2001 | Hosokawa | ....................... | 62/378 |
| 2003/0010446 A1 | 1/2003 | Kajiyama et al. | | |
| 2003/0019428 A1 * | 1/2003 | Ku et al. | ........................ | 118/715 |
| 2005/0070100 A1 * | 3/2005 | Yamasaki et al. | ............. | 438/685 |
| 2007/0295272 A1 * | 12/2007 | Padhi et al. | .................... | 118/715 |

OTHER PUBLICATIONS

Emissivity values table—Omega.com; internet archieve results showing this table was first made public in Jan. '04.*

* cited by examiner

*Primary Examiner* — Jeffrie R Lund
*Assistant Examiner* — Satish Chandra
(74) *Attorney, Agent, or Firm* — Oblon, Spivak, McClelland, Maier & Neustadt, L.L.P.

(57) ABSTRACT

A method and apparatus for treating a substrate in a processing system. The processing system includes a process chamber having a pumping system configured to evacuate the process chamber, a substrate holder coupled to the process chamber and configured to support the substrate and heat the substrate, and a process gas delivery system coupled to the process chamber and configured to introduce a process gas to a process space above an upper surface of the substrate. Furthermore, the process chamber includes one or more apparatus surfaces in radiative communication with the upper surface of the substrate and having a low emissivity and/or high reflectivity.

25 Claims, 10 Drawing Sheets

METHOD AND APPARATUS FOR REDUCING SUBSTRATE TEMPERATURE VARIABILITY

BACKGROUND OF THE INVENTION

1. Field of Invention

The present invention relates to a method and system for thin film deposition, and more particularly to a method and apparatus for reducing substrate temperature variability from one substrate to another substrate when processed in a thin film deposition system.

2. Description of Related Art

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperatures between about 400° C. and about 500° C., or lower.

For example, Cu integration schemes for technology nodes less than or equal to 130 nm can utilize a low dielectric constant (low-k) inter-level dielectric, followed by a physical vapor deposition (PVD) Ta layer or a TaN/Ta layer, followed by a PVD Cu seed layer, and an electro-chemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, these studies including such materials as chromium, tantalum, molybdenum and tungsten. Each of these materials exhibits low miscibility in Cu. More recently, other materials, such as ruthenium (Ru) and rhodium (Rh), have been identified as potential barrier layers since they are expected to behave similarly to conventional refractory metals. However, the use of Ru or Rh can permit the use of only one barrier layer, as opposed to two layers, such as Ta/TaN. This observation is due to the adhesive and barrier properties of these materials. For example, one Ru layer can replace the Ta/TaN barrier layer. Moreover, current research is finding that the one Ru layer can further replace the Cu seed layer, and bulk Cu fill can proceed directly following Ru deposition. This observation is due to good adhesion between the Cu and the Ru layers.

Conventionally, Ru layers can be formed by thermally decomposing a ruthenium-containing precursor, such as a ruthenium carbonyl precursor, in a thermal chemical vapor deposition (TCVD) process. Material properties of Ru layers that are deposited by thermal decomposition of ruthenium carbonyl precursors (e.g., $Ru_3(CO)_{12}$) can deteriorate when the substrate temperature is lowered to below about 400° C. As a result, an increase in the (electrical) resistivity of the Ru layers and poor surface morphology (e.g., the formation of nodules) at low deposition temperatures has been attributed to increased incorporation of reaction by-products into the thermally deposited Ru layers. Both effects can be explained by a reduced carbon monoxide (CO) desorption rate from the thermal decomposition of the ruthenium carbonyl precursor at substrate temperatures below about 400° C.

Additionally, the use of metal carbonyls, such as ruthenium carbonyl or rhenium carbonyl, can lead to poor deposition rates due to their low vapor pressure, and the transport issues associated therewith. For example, the inventors have observed that current deposition systems suffer from such a low rate, making the deposition of such metal films impractical. Furthermore, the inventors have observed that current deposition systems suffer from poor within-substrate film uniformity, as well as film variability from one substrate to another substrate.

SUMMARY OF THE INVENTION

A method and system is provided for reducing temperature variability in a wafer processing system such as a thin film deposition system.

According to one embodiment, a processing system for treating a substrate is described, including: a process chamber having a pumping system configured to evacuate the process chamber; a substrate holder coupled to the process chamber and configured to support the substrate and heat the substrate; and a process gas delivery system coupled to the process chamber and configured to introduce a process gas to a process space above an upper surface of the substrate. The process chamber includes one or more apparatus surfaces in radiative communication with the upper surface of the substrate and having an emissivity value equal to or less than approximately 0.09.

According to another embodiment, a processing system for treating a substrate is described, including a process chamber having a pumping system configured to evacuate the process chamber; a substrate holder coupled to the process chamber and configured to support the substrate and heat the substrate; and a process gas delivery system coupled to the process chamber and configured to introduce a process gas to a process space above an upper surface of the substrate. The process chamber includes one or more apparatus surfaces in radiative communication with the upper surface of the substrate and having a polished metal surface having a maximum roughness of less than approximately 5 microns.

According to another embodiment, a processing system is described, including: a thermal chemical vapor deposition (CVD) system configured to form a thin film on a substrate supported therein, the thermal CVD system comprising one or more apparatus surfaces in radiative communication with an upper surface of the substrate. At least one of the one or more apparatus surfaces has an emissivity value equal to or less than approximately 0.09.

According to yet another embodiment, a method of depositing a metal layer on a substrate is described. The method includes providing a substrate on a substrate holder in a process chamber of a deposition system; providing a vapor distribution surface above the substrate and opposing an upper surface of the substrate and elevating the temperature of the substrate holder, to heat the substrate. Also included is forming a process gas containing a metal carbonyl precursor vapor and a CO gas; introducing the process gas into the process chamber through the vapor distribution surface; and exposing the substrate to the process gas to deposit a metal layer on the substrate by a vapor deposition process. The vapor distribution surface has an emissivity value equal to or less than approximately 0.09.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
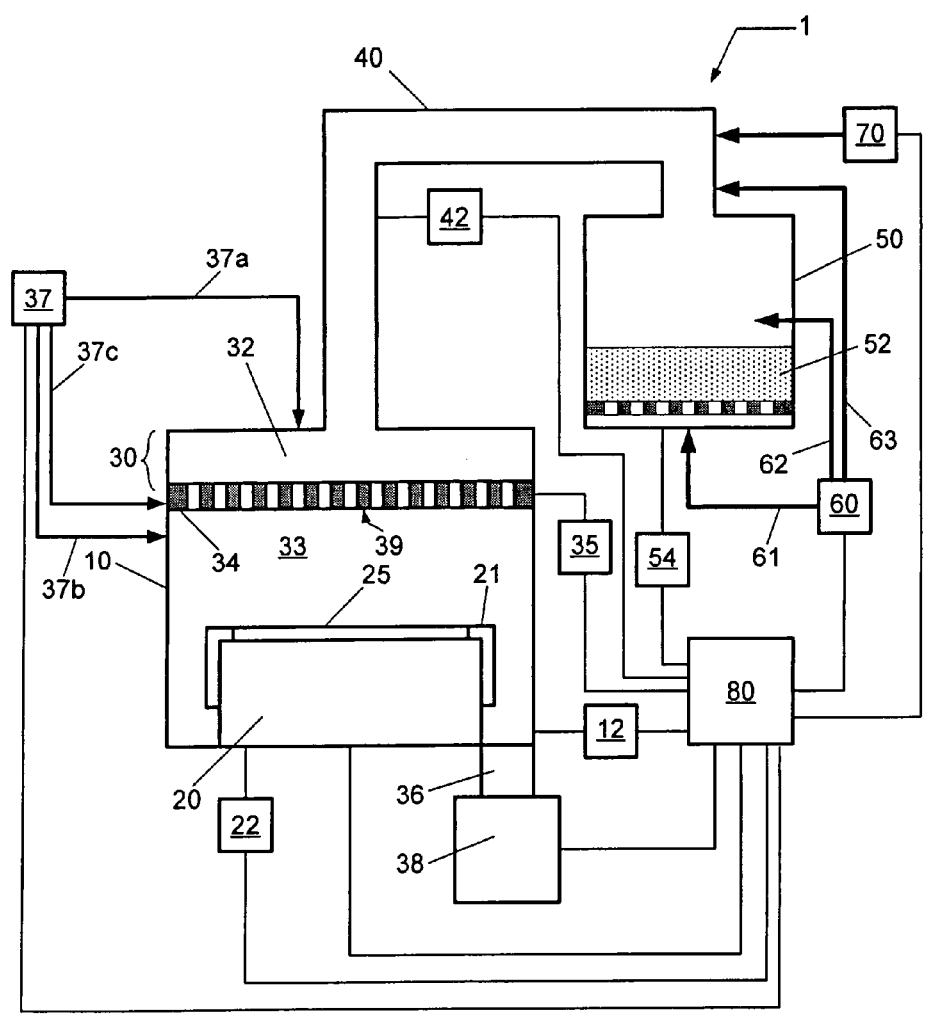
FIG. 1 depicts a schematic view of a deposition system according to an embodiment.

Referring now to the drawings, wherein like reference numerals designate identical or corresponding parts throughout the several views, FIG. 1 schematically illustrates a thermal chemical vapor deposition system 1 for depositing a thin film, such as a metal layer, on a substrate from a film precursor, such as a metal carbonyl precursor, according to one embodiment. While other film precursors, including metal carbonyl precursors, may be used, embodiments of the invention may henceforth be described with particular reference to ruthenium carbonyl precursors, such as $Ru_3(CO)_{12}$, with the understanding that the invention is not so limited. The deposition system 1 comprises a process chamber 10 having a substrate holder 20 configured to support a substrate 25, upon which the metal layer is formed. The process chamber 10 is coupled to a process gas delivery system configured to introduce a process gas to the process chamber 10. For example, the process gas delivery system can include a metal precursor vaporization system 50 coupled to the process chamber 10 via a vapor precursor delivery system 40 and a vapor distribution system 30, wherein the metal precursor vaporization system 50 is configured to introduce a metal precursor vapor to the process chamber 10.

The process chamber 10 is further coupled to a vacuum pumping system 38 through a duct 36, wherein the pumping system 38 is configured to evacuate the process chamber 10, vapor precursor delivery system 40, and metal precursor vaporization system 50 to a pressure suitable for forming the metal layer on the substrate 25, and suitable for evaporation (or sublimation) of the metal carbonyl precursor 52 in the metal precursor vaporization system 50.

Still referring to FIG. 1, the metal precursor vaporization system 50 is configured to store a metal carbonyl precursor 52, to heat the metal carbonyl precursor 52 to a temperature sufficient for vaporizing the metal carbonyl precursor 52, and to introduce metal carbonyl precursor vapor to the vapor precursor delivery system 40. The metal carbonyl precursor 52 can be solid under the selected heating conditions in the metal precursor vaporization system 50. Alternately, the metal carbonyl precursor 52 can be a liquid. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. Below, the use of a solid metal carbonyl precursor 52 is described; however, those skilled in the art will appreciate that metal carbonyl precursors that are liquids under the selected heating conditions can be used without departing from the scope of the invention. For instance, the metal carbonyl precursor can have the general formula $M_x(CO)_y$, and can comprise a tungsten carbonyl, a molybdenum carbonyl, a cobalt carbonyl, a rhodium carbonyl, a rhenium carbonyl, a chromium carbonyl, or an osmium carbonyl, or a combination of two or more thereof. These metal carbonyls include, but are not limited to, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

In order to achieve the desired temperature for vaporizing the metal carbonyl precursor 52 (e.g., subliming the solid metal carbonyl precursor 52), the metal precursor vaporization system 50 is coupled to a vaporization temperature control system 54 configured to control the vaporization temperature. For instance, the temperature of the metal carbonyl precursor 52 is generally elevated to approximately 40° C. to 45° C. in conventional systems in order to sublime the ruthenium carbonyl $Ru_3(CO)_{12}$. At this temperature, the vapor pressure of the $Ru_3(CO)_{12}$, for instance, ranges from approximately 1 to approximately 3 mtorr. As the metal carbonyl precursor is heated to cause evaporation (or sublimation), a carrier gas can be passed over or through the metal carbonyl precursor 52, or any combination thereof. The carrier gas can include, for example, an inert gas, such as a noble gas, He, Ne, Ar, Kr, or Xe, or a combination of two or more thereof. Alternately, other embodiments contemplate omitting the inert carrier gas.

Additionally, a CO gas can be added to the inert carrier gas. Alternately, other embodiments contemplate the CO gas replacing the inert carrier gas. For example, a gas supply system 60 is coupled to the metal precursor vaporization system 50, and it is configured to, for instance, supply a carrier gas, a CO gas, or a mixture thereof, beneath the metal carbonyl precursor 52 via feed line 61, or over the metal carbonyl precursor 52 via feed line 62. In addition, or in the alternative, the gas supply system 60 is coupled to the vapor precursor delivery system 40 downstream from the metal precursor vaporization system 50 to supply the gas to the vapor of the metal carbonyl precursor 52 via feed line 63 as or after it enters the vapor precursor delivery system 40. Although not shown, the gas supply system 60 can comprise a carrier gas source, a CO gas source, one or more control valves, one or more filters, and a mass flow controller. For instance, the flow rate of the inert carrier gas can be between about 0.1 standard cubic centimeters per minute (sccm) and about 1000 sccm. Alternately, the flow rate of the inert carrier gas can be between about 10 sccm and about 500 sccm. Still alternately, the flow rate of the inert carrier gas can be between about 50 sccm and about 200 sccm. According to embodiments of the invention, the flow rate of the CO gas can range from approximately 0.1 sccm to approximately 1000 sccm. Alternately, the flow rate of the CO gas can be between about 1 sccm and about 100 sccm.

Downstream from the film precursor vaporization system 50, the metal precursor vapor flows with the CO gas and optional inert carrier gas through the vapor delivery system 40 until it enters a vapor distribution system 30 coupled to or within the process chamber 10. The vapor delivery system 40 can be coupled to a vapor line temperature control system 42 in order to control the vapor line temperature and prevent decomposition of the film precursor vapor as well as condensation of the film precursor vapor. For example, the vapor line temperature can be set to a value approximately equal to or greater than the vaporization temperature. Additionally, for example, the vapor delivery system 40 can be characterized by a high conductance in excess of about 50 liters/second.

Referring again to FIG. 1, the vapor distribution system 30, coupled to the process chamber 10, comprises a plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34. For example, the temperature of the vapor distribution plate can be set to a value approximately equal to the vapor line temperature. However, it may be less, or it may be greater.

Optionally, a dilution gas source 37 is coupled to the process chamber 10 and/or vapor distribution system 30 and is configured to add a dilution gas to dilute the process gas containing the metal carbonyl precursor vapor and the CO gas. As shown in FIG. 1, the dilution gas source 37 can be coupled to the vapor distribution system 30 via feed line 37a and configured to add the dilution gas to the process gas in the vapor distribution plenum 32 before the process gas passes through the vapor distribution plate 34 into the processing zone 33. Alternately, the dilution gas source 37 can be coupled to the process chamber 10 via feed line 37b and configured to add the dilution gas to the process gas in the processing zone 33 above the substrate 25 after the process gas passes through the vapor distribution plate 34. Still alternately, the dilution gas source 37 can be coupled to the vapor distribution system 30 via feed line 37c and configured to add the dilution gas to the process gas in the distribution plate 34. As will be appreciated by those skilled in the art, the dilution gas can be added to the process gas at other locations in the vapor distribution system 30 and the process chamber 10 without departing from the scope of the invention.

Additionally, for example, the dilution gas is introduced to the process gas from the dilution gas source 37 through one of feed lines 37a, 37b, 37c, or other feed lines (not shown) in such a way that the concentration of dilution gas at one region above substrate 25 can be adjusted to be different than the concentration of dilution gas at another region above substrate 25. For example, the flow of dilution gas to a central region of substrate 25 can be different than the flow of dilution gas to a peripheral region of substrate 25.

According to an embodiment, at least one internal apparatus surface of process chamber 10 in radiative communication with substrate 25 is configured to have an emissivity having a value equal to or less than approximately 0.09. Alternatively, the apparatus surface is configured to have an emissivity value equal to or less than approximately 0.06. Alternatively yet, the apparatus surface is configured to have an emissivity value equal to or lesser than approximately 0.04. For example, the at least one apparatus surface can include the lower surface 39 of vapor distribution plate 34. As will be described later, the present inventor discovered that apparatus surfaces in radiative communication with substrate 25 and having the properties of being less emissive and/or more reflective tend to reduce the temperature variability between substrates processed in process chamber 10. This is particularly true for surfaces of the process chamber 10 in contact with processing zone 133.

Once film precursor vapor enters the processing zone 33, the film precursor vapor thermally decomposes upon adsorption at the substrate surface due to the elevated temperature of the substrate 25, and a thin film is formed on the substrate 25. The substrate holder 20 is configured to elevate the temperature of substrate 25 by virtue of the substrate holder 20 being coupled to a substrate temperature control system 22. For example, the substrate temperature control system 22 can be configured to elevate the temperature of substrate 25 up to approximately 500° C. In one embodiment, the substrate temperature can range from about 100° C. to about 500° C. In another embodiment, the substrate temperature can range from about 300° C. to about 400° C. Additionally, process chamber 10 can be coupled to a chamber temperature control system 12 configured to control the temperature of the chamber walls.

The substrate holder 20 may further comprise a shield ring 21 that extends radially from the peripheral edge of substrate 25 to the peripheral edge of substrate holder 20. Additionally, the shield ring 21 may cover the outer corner of substrate holder 20, and may partially or fully extend along the side of substrate holder 20. The shield ring 21 may be fabricated from a metal, such as aluminum, stainless steel, etc., or it may be fabricated from a ceramic or a plastic. Additionally, the shield ring 21 may be coated with a protective barrier, such as a surface layer anodization or a spray coating. For instance, the shield ring can include anodized aluminum, alumina, aluminum nitride, sapphire, quartz, silicon, silicon nitride, silicon carbide, carbon, TEFLON®, KAPTON®, etc. Furthermore, a thermal insulator may be disposed between the shield ring 21 and the substrate holder 20. For example, the thermal insulator may include a gap that limits the physical contact between the shield ring 21 and the substrate holder 20.

As described above, for example, conventional systems have contemplated operating the film precursor vaporization system 50, as well as the vapor delivery system 40, within a temperature range of approximately 40-45° C. for ruthenium carbonyl in order to limit metal vapor precursor decomposition and metal vapor precursor condensation. For example, the ruthenium carbonyl precursor can decompose at elevated temperatures to form by-products, such as those illustrated below:

$$Ru_3(CO)_{12}{}^*(ad) \Leftrightarrow Ru_3(CO)_x{}^*(ad)+(12-x)CO(g) \qquad (1)$$

or, $$Ru_3(CO)_x{}^*(ad) \Leftrightarrow 3Ru(s)+xCO(g) \qquad (2)$$

wherein these by-products can adsorb (ad), i.e., condense, on the interior surfaces of the deposition system 1. The accumulation of material on these surfaces can cause problems from one substrate to the next, such as process repeatability. Alternatively, for example, the ruthenium carbonyl precursor can condense at depressed temperatures to cause recrystallization, viz.

$$Ru_3(CO)_{12}(g) \Leftrightarrow Ru_3(CO)_{12}{}^*(ad) \qquad (3).$$

In summary, low vapor pressure of some metal carbonyl precursors (e.g., $Ru_3(CO)_{12}$) and the small process window, results in very a low deposition rate of a metal layer on the substrate 25.

Adding a CO gas to the metal carbonyl precursor vapor can reduce the above-mentioned problems that limit the delivery of the metal carbonyl precursor to the substrate. Thus, according to an embodiment of the invention, the CO gas is added to the metal carbonyl precursor vapor to reduce dissociation of the metal carbonyl precursor vapor in the gas line, thereby shifting the equilibrium in Equation (1) to the left and reducing premature decomposition of the metal carbonyl precursor in the vapor precursor delivery system 40 prior to delivery of the metal carbonyl precursor to the process chamber 10. It is believed that addition of the CO gas to the metal carbonyl precursor vapor allows for increasing the vaporization temperature from approximately 40° C. to approximately 150°

C., or higher. The elevated temperature increases the vapor pressure of the metal carbonyl precursor, resulting in increased delivery of the metal carbonyl precursor to the process chamber and, hence, increased deposition rate of the metal on the substrate 25. Furthermore, it has been visually observed that flowing a mixture of an inert gas, such as Ar, and the CO gas over or through the metal carbonyl precursor reduces premature decomposition of the metal carbonyl precursor.

The addition of CO gas to a $Ru_3(CO)_{12}$ precursor vapor allows for maintaining the $Ru_3(CO)_{12}$ precursor vaporization temperature from approximately 40° C. to approximately 150° C. Alternately, the vaporization temperature can be maintained at approximately 60° C. to approximately 90° C.

Thermal decomposition of metal carbonyl precursors and subsequent metal deposition on the substrate 25 is thought to proceed predominantly by CO elimination and desorption of CO by-products from the substrate 25. Incorporation of CO by-products into the metal layers during deposition can result from incomplete decomposition of the metal carbonyl precursor, incomplete removal of CO by-products from the metal layer, and re-adsorption of CO by-products from the process chamber 10 onto the metal layer.

It is believed that CO incorporation into a metal layer during deposition leads to surface roughness in the form of nodules in the metal layer, where the growth of nodules is enhanced by increased incorporation of CO by-products into the metal layer. The number of nodules is expected to increase as the thickness of the metal layer increases. Furthermore, the incorporation of CO by-products into the metal layer increases the resistivity of the metal layer.

Incorporation of CO by-products into the metal layer can be reduced by (1) lowering the process pressure, and (2) increasing the substrate temperature. In accordance with the present invention, it has been realized that the above-mentioned problems can also be reduced by adding a dilution gas in the process chamber 10 to the process gas containing the metal carbonyl precursor vapor and the CO gas for controlling and reducing the partial pressure of by-products and the CO gas in the process chamber. Thus, as an option, a dilution gas from dilution gas source 37 is added to the process gas for controlling and reducing the partial pressure of CO by-products on the metal layer and the partial pressure of CO in the process chamber 10, thereby forming a smooth metal layer. The dilution gas can include, for example, an inert gas, such as a noble gas, He, Ne, Ar, Kr, or Xe, or a mixture of two or more thereof. The dilution gas may further contain CO. Additionally, the dilution gas may further contain a reducing gas to improve the material properties of the metal layer, for example the electrical resistivity. The reducing gas can, for example, contain $H_2$, a silicon-containing gas (e.g., $SiH_4$, $Si_2H_6$, or $SiCl_2H_2$), a boron-containing gas (e.g., $BH_3$, $B_2H_6$, or $B_3H_9$), or a nitrogen-containing gas (e.g., $NH_3$). The process chamber pressure can be between about 0.1 mTorr and about 200 mTorr. Alternately, the process chamber pressure can be between about 1 mTorr and about 100 mTorr. Still alternately, the process chamber pressure can be between about 2 mTorr and about 50 mTorr.

Since the addition of the CO gas to the metal carbonyl precursor vapor increases the thermal stability of the metal carbonyl precursor vapor, the relative concentration of the metal carbonyl precursor vapor to the CO gas in the process gas can be utilized to control the decomposition rate of the metal carbonyl precursor on the substrate 25 at a certain substrate temperature. Furthermore, the substrate temperature can be utilized to control the decomposition rate (and thereby the deposition rate) of the metal on the substrate 25.

As those skilled in the art will readily appreciate, the amount of CO gas and the substrate temperature can easily be varied to allow for a desired vaporization temperature of the metal carbonyl precursor and for achieving a desired deposition rate of the metal carbonyl precursor on the substrate 25.

Furthermore, the amount of CO gas in the process gas can be selected so that metal deposition on the substrate 25 from a metal carbonyl precursor occurs in a kinetic-limited temperature regime. For example, the amount of CO gas in the process gas can be increased until the metal deposition process is observed to occur in a kinetic-limited temperature regime. A kinetic-limited temperature regime refers to the range of deposition conditions where the deposition rate of a chemical vapor deposition process is limited by the kinetics of the chemical reactions at the substrate surface, typically characterized by a strong dependence of deposition rate on temperature. Unlike the kinetic-limited temperature regime, a mass-transfer limited regime is normally observed at higher substrate temperatures and includes a range of deposition conditions where the deposition rate is limited by the flux of chemical reactants to the substrate surface. A mass-transfer limited regime is characterized by a strong dependence of deposition rate on metal carbonyl precursor flow rate and is independent of deposition temperature. Metal deposition in the kinetic-limited regime normally results in good step coverage and good conformality of the metal layer on patterned substrates. Conformality is commonly defined as the thinnest part of the metal layer on the sidewall of a feature on the patterned substrate divided by the thickest part of the metal layer on the sidewall. Step coverage is commonly defined as the sidewall coverage (metal layer thickness on the sidewall divided by the metal layer thickness away from the feature) divided by the bottom coverage (metal layer thickness on the bottom of the feature divided by the metal layer thickness away from the feature).

Still referring to FIG. 1, optionally, the deposition system 1 can be periodically cleaned using an in-situ cleaning system 70 coupled to, for example, the vapor delivery system 40, as shown in FIG. 1. Per a frequency determined by the operator, the in-situ cleaning system 70 can perform routine cleanings of the deposition system 1 in order to remove accumulated residue on internal surfaces of deposition system 1. The in-situ cleaning system 70 can, for example, comprise a radical generator configured to introduce a chemical radical capable of chemically reacting and removing such residue. Additionally, for example, the in-situ cleaning system 70 can, for example, include an ozone generator configured to introduce a partial pressure of ozone. For instance, the radical generator can include an upstream plasma source configured to generate oxygen or fluorine radicals from oxygen ($O_2$), nitrogen trifluoride ($NF_3$), $O_3$, $XeF_2$, $ClF_3$, or $C_3F_8$ (or, more generally, $C_xF_y$), respectively. The radical generator can include an ASTRON® reactive gas generator, commercially available from MKS Instruments, Inc., ASTeX® Products (90 Industrial Way, Wilmington, Mass. 01887).

Still referring the FIG. 1, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor delivery system 40, the film precursor vaporization system 50, the carrier gas supply system 60, the dilution gas source 37, and the optional in-situ cleaning system 70.

Figure 2:
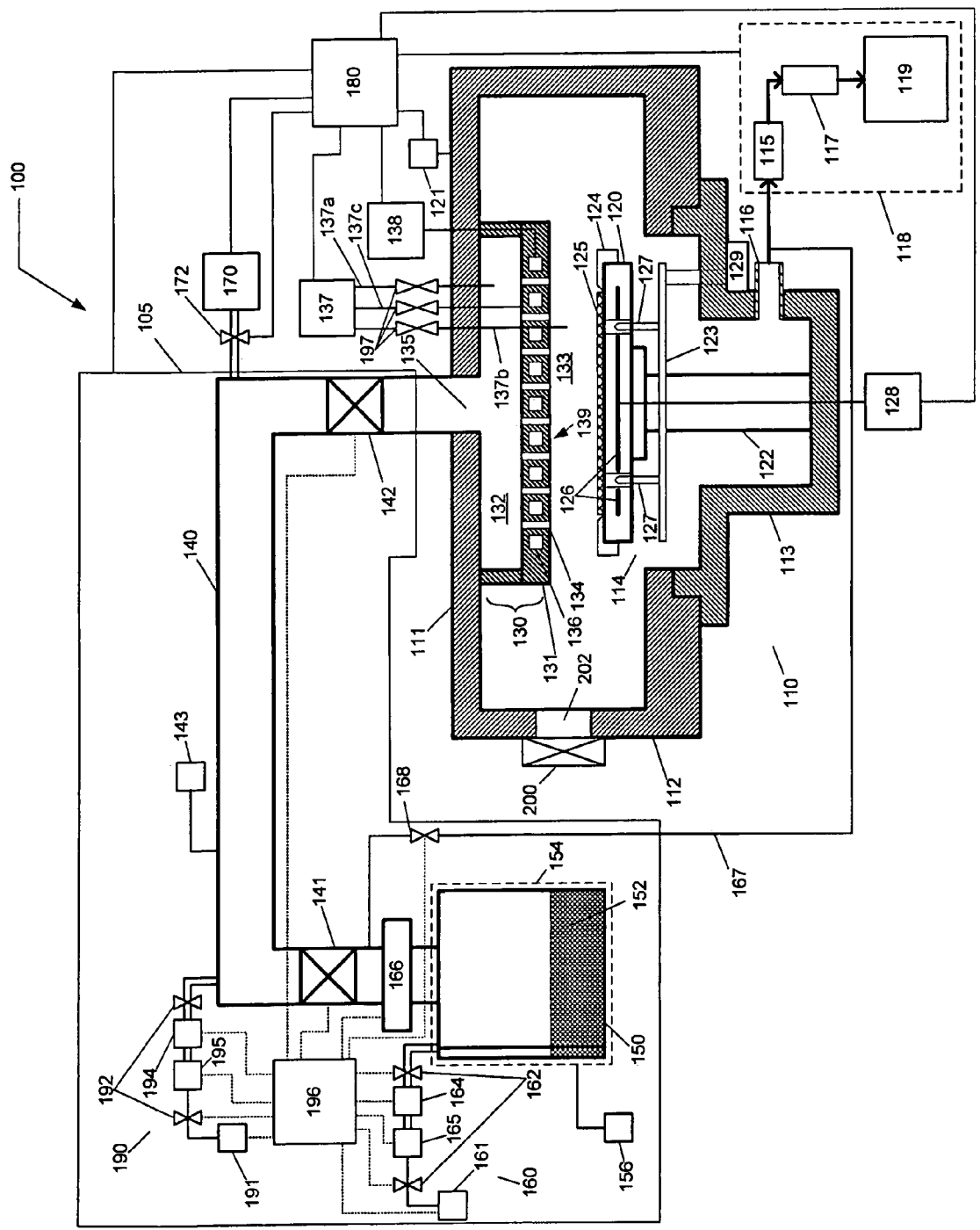
FIG. 2 depicts a schematic view of a deposition system according to another embodiment.

In another embodiment, FIG. 2 illustrates a deposition system 100 for depositing a metal film, such as a ruthenium (Ru) film, on a substrate. The deposition system 100 comprises a process chamber 110 having a substrate holder 120 configured to support a substrate 125 upon which the metal layer is formed. The process chamber 110 is coupled to a precursor delivery system 105 having metal precursor vaporization system 150 configured to store and evaporate a metal carbonyl precursor 152, and a vapor precursor delivery system 140 configured to transport the metal carbonyl precursor 152 to the process chamber 110.

The process chamber 110 comprises an upper chamber section 111, a lower chamber section 112, and an exhaust chamber 113. An opening 114 is formed within lower chamber section 112, where lower chamber section 112 couples with exhaust chamber 113.

Referring still to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. An optional shield ring 124 for reducing CO poisoning on the substrate 125 on the substrate holder 120 is provided on the edge of substrate holder 120. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the substrate 125 or substrate holder 120.

The optional shield ring 124 is positioned on the peripheral edge of substrate holder 120 and configured to surround substrate 125 such that the relative increase in the production of CO by-products above the peripheral edge of substrate holder 120 is reduced. Due to limited thermal contact between the shield ring 124 and the substrate holder 120, the shield ring temperature (T) reaches a value between the temperature of the substrate holder 120 and the temperature of the substrate 125. Desirably, the temperature (T) of the shield ring 124 is substantially the same as the temperature of substrate 125.

The shield ring 124 can extend radially from the peripheral edge of substrate 125 to the peripheral edge of substrate holder 120. Additionally, the shield ring 124 may cover the outer corner of substrate holder 120, and may partially or fully extend along the side of substrate holder 120. The shield ring 124 may be fabricated from a metal, such as aluminum, stainless steel, etc., or it may be fabricated from a ceramic or a plastic. Additionally, the shield ring 124 may be coated with a protective barrier, such as a surface layer anodization or a spray coating. For instance, the shield ring can include anodized aluminum, alumina, aluminum nitride, sapphire, quartz, silicon, silicon nitride, silicon carbide, carbon, TEFLON®, KAPTON®, etc. Furthermore, a thermal insulator may be disposed between the shield ring 124 and the substrate holder 120.

During processing, the heated substrate 125 can thermally decompose the metal carbonyl precursor vapor, and enable deposition of a metal layer on the substrate 125. According to an embodiment, the metal carbonyl precursor 152 can be a ruthenium carbonyl precursor, for example $Ru_3(CO)_{12}$. As will be appreciated by those skilled in the art of thermal chemical vapor deposition, other metal carbonyl precursors and other ruthenium carbonyl precursors can be used without departing from the scope of the invention. The substrate holder 120 is heated to a pre-determined temperature that is suitable for depositing the desired Ru metal layer or other metal layer onto the substrate 125. Additionally, a heater (not shown) coupled to a chamber temperature control system 121 can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 0.1 mTorr and about 200 mTorr. Alternately, the process chamber pressure can be between about 1 mTorr and about 100 mTorr. Still alternately, the process chamber pressure can be between about 2 mTorr and about 50 mTorr.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

Additionally, a dilution gas source 137 is coupled to the process chamber 110 and is configured to add a dilution gas to dilute the process gas containing the metal carbonyl precursor vapor and the CO gas using feed lines 137a, 137b, and/or 137c, valves 197, one or more filters (not shown), and a mass flow controller (not shown). As shown in FIG. 2, the dilution gas source 137 can be coupled to the vapor distribution system 130 of process chamber 110 and is configured to add the dilution gas to the process gas in the vapor distribution plenum 132 via feed line 137a before the process gas passes through the vapor distribution plate 131 into the processing zone 133 above the substrate 125, or the dilution gas source 137 can be configured to add the dilution gas to the process gas inside the vapor distribution plate 131 via feed line 137c. Alternately, the dilution gas source 137 can be coupled to the process chamber 110 and is configured to add the dilution gas to the process gas in the processing zone 133 via feed line 137b after the process gas passes through the vapor distribution plate 131. As will be appreciated by those skilled in the art, the dilution gas can be added to the process gas at other locations in the process chamber 110 without departing from the scope of the invention.

Furthermore, the dilution gas may be introduced to the process gas from the dilution gas source 137 through one of feed lines 137a, 137b, 137c, or other feed lines (not shown) in such a way that the concentration of dilution gas at one region above substrate 125 can be adjusted to be different than the concentration of dilution gas at another region above substrate 125. For example, the flow of dilution gas to a central region of substrate 125 can be different than the flow of dilution gas to a peripheral region of substrate 125.

Furthermore, an opening 135 is provided in the upper chamber section 111 for introducing a metal carbonyl precursor vapor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the metal carbonyl precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C.

As illustrated in FIG. 2, a metal precursor vaporization system 150 is configured to hold a metal carbonyl precursor 152 and evaporate (or sublime) the metal carbonyl precursor 152 by elevating the temperature of the metal carbonyl precursor. A precursor heater 154 is provided for heating the metal carbonyl precursor 152 to maintain the metal carbonyl precursor 152 at a temperature that produces a desired vapor pressure of metal carbonyl precursor 152. The precursor heater 154 is coupled to a vaporization temperature control system 156 configured to control the temperature of the metal carbonyl precursor 152. For example, the precursor heater 154 can be configured to adjust the temperature of the metal carbonyl precursor 152 from about 40° C. to about 150° C., or from about 60° C. to about 90° C.

As the metal carbonyl precursor 152 is heated to cause evaporation (or sublimation), a carrier gas can be passed over or through the metal carbonyl precursor 152, or any combination thereof. The carrier gas can include, for example, an inert gas, such as a noble gas (i.e., He, Ne, Ar, Kr, Xe). Alternately, other embodiments contemplate omitting the inert carrier gas. According to an embodiment of the invention, a CO gas can be added to the inert carrier gas. Alternately, other embodiments contemplate the CO gas replacing the inert carrier gas. For example, a gas supply system 160 is coupled to the metal precursor vaporization system 150, and it is configured to, for instance, flow the carrier gas, the CO gas, or both, over or through the metal carbonyl precursor 152. Although not shown in FIG. 2, gas supply system 160 can also or alternatively be coupled to the vapor precursor delivery system 140 to supply the CO gas and optional inert carrier gas to the vapor of the metal precursor 152 as or after it enters the vapor precursor delivery system 140. The gas supply system 160 can comprise a gas source 161 containing an inert carrier gas, a CO gas, or a mixture thereof, one or more control valves 162, one or more filters 164, and a mass flow controller 165. For instance, the mass flow rate of inert carrier gas or the CO gas can range from approximately 0.1 sccm to approximately 1000 sccm.

Additionally, a sensor 166 is provided for measuring the total gas flow from the metal precursor vaporization system 150. The sensor 166 can, for example, comprise a mass flow controller, and the amount of metal carbonyl precursor vapor delivered to the process chamber 110 can be determined using sensor 166 and mass flow controller 165. Alternately, the sensor 166 can comprise a light absorption sensor to measure the concentration of the metal carbonyl precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the metal carbonyl precursor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142, respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the metal carbonyl precursor vapor in the vapor line. The temperature of the vapor lines can be controlled from about 20° C. to about 100° C., or from about 40° C. to about 90° C.

Moreover, a CO gas can be supplied from a gas supply system 190. For example, the gas supply system 190 is coupled to the vapor precursor delivery system 140, and it is configured to, for instance, mix the CO gas with the metal carbonyl precursor vapor in the vapor precursor delivery system, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm to approximately 1000 sccm.

Mass flow controllers 165 and 195, and valves 162, 192, 168, 141, and 142 are controlled by controller 196, which controls the supply, shutoff, and the flow of the inert carrier gas, the CO gas, and the metal carbonyl precursor vapor. Sensor 166 is also connected to controller 196 and, based on output of the sensor 166, controller 196 can control the carrier gas flow through mass flow controller 165 to obtain the desired metal carbonyl precursor flow to the process chamber 110.

According to an embodiment, at least one internal apparatus surface of process chamber 110 in radiative communication with substrate 125 is configured to have an emissivity value equal to or less than approximately 0.09. Alternatively, the apparatus surface is configured to have an emissivity value equal to or less than approximately 0.06. Alternatively, the apparatus surface is configured to have an emissivity value equal to or less than approximately 0.04. For example, the at least one apparatus surface can include the lower surface 139 of vapor distribution plate 134. As will be described later, the present inventor discovered that apparatus surfaces in radiative communication with substrate 125 and having the properties of being less emissive and/or more reflective tend to reduce the temperature variability between substrates processed in process chamber 110. This is particularly true for surfaces of the process chamber 110 in contact with processing zone 133.

Furthermore, as described above, and as shown in FIG. 2, an optional in-situ cleaning system 170 is coupled to the precursor delivery system 105 of deposition system 100 through cleaning valve 172. For instance, the in-situ cleaning system 170 can be coupled to the vapor delivery system 140. The in-situ cleaning system 170 can, for example, comprise a radical generator configured to introduce a chemical radical capable of chemically reacting and removing such residue. Additionally, for example, the in-situ cleaning system 170 can, for example, include an ozone generator configured to introduce a partial pressure of ozone. For instance, the radical generator can include an upstream plasma source configured to generate oxygen or a fluorine radical from oxygen ($O_2$), nitrogen trifluoride ($NF_3$), $ClF_3$, $O_3$, $XeF_2$, or $C_3F_8$ (or, more generally, $C_xF_y$), respectively. The radical generator can include an ASTRON® reactive gas generator, commercially available from MKS Instruments, Inc., ASTeX® Products (90 Industrial Way, Wilmington, Mass. 01887).

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater).

Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted metal carbonyl precursor material and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below to the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Referring again to FIG. 2, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 143, metal precursor vaporization system 150, gas supply system 190, gas supply system 160, and vaporization temperature control system 156; vapor distribution temperature control system 138; dilution gas source 137; vacuum pumping system 118; and substrate holder temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex. The controller 180 may also be implemented as a general-purpose computer, digital signal process, etc.

Controller 180 may be locally located relative to the deposition system 100, or it may be remotely located relative to the deposition system 100 via the internet or an intranet. Thus, controller 180 can exchange data with the deposition system 100 using at least one of a direct connection, an intranet, or the internet. Controller 180 may be coupled to an intranet at a customer site (i.e., a device maker, etc.), or coupled to an intranet at a vendor site (i.e., an equipment manufacturer). Furthermore, another computer (i.e., controller, server, etc.) can access controller 180 to exchange data via at least one of a direct connection, an intranet, or the internet.

Figure 3:
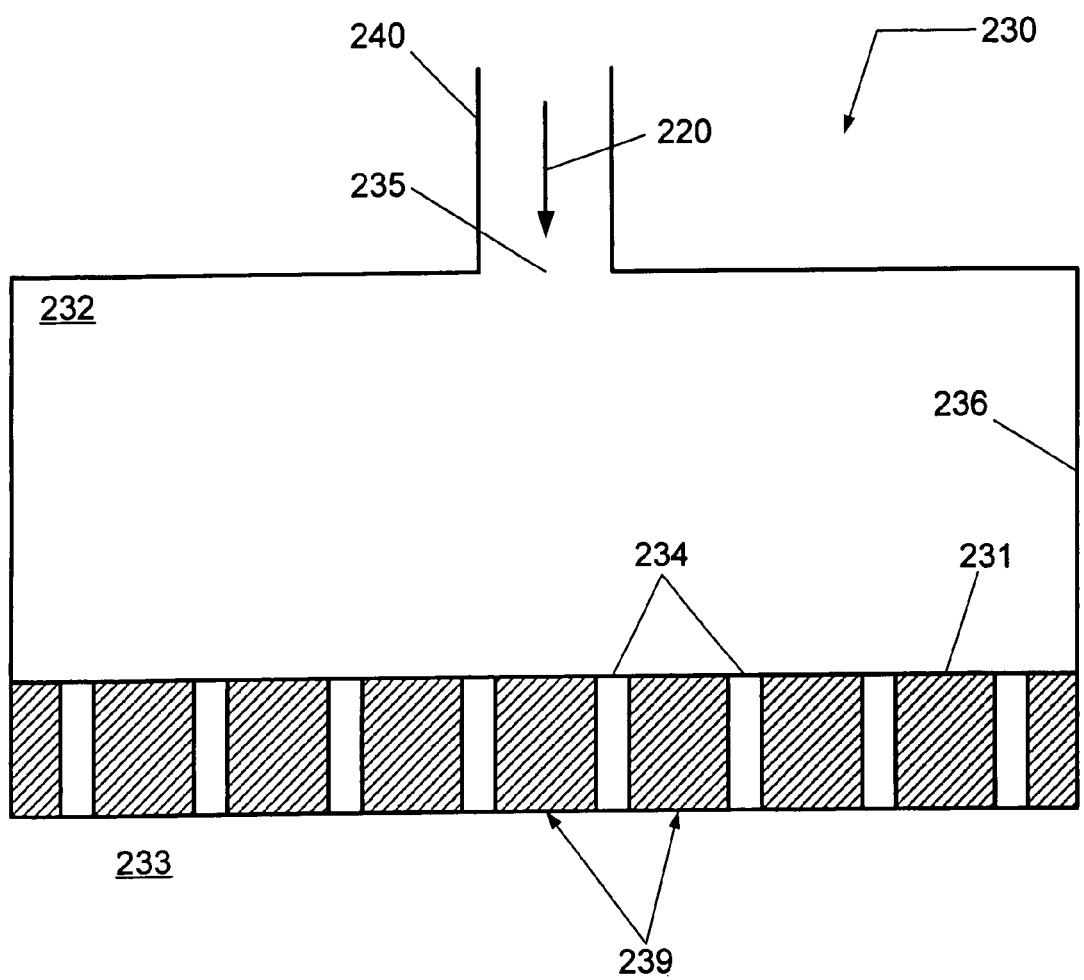
FIG. 3 provides a cross-sectional view of a precursor vapor distribution system according to another embodiment.

Referring now to FIG. 3, a vapor distribution system 230 is illustrated in accordance with one embodiment. The vapor distribution system 230 comprises a housing 236 configured to be coupled to or within a process chamber of a deposition system (such as process chamber 10 or 110 of deposition system 1 or 100, respectively), and a vapor distribution plate 231 configured to be coupled to the housing 236, wherein the combination forms a plenum 232. The vapor distribution system 230 is configured to receive a process gas 220 into the plenum 232 from vapor delivery system 240 through opening 235. The vapor distribution plate 231 comprises a plurality of orifices 234 arranged to introduce and distribute the process gas 220 from plenum 232 to a process space 233 proximate a substrate (not shown) upon which a metal film is to be formed.

In addition, the vapor distribution system 230 may be configured to receive a dilution gas from a dilution gas source (not shown) into plenum 232, hence, permitting the process gas 220 and the dilution gas to mix in the plenum 232. Thereafter, the mixture of the dilution gas and the process gas 220 is distributed into process space 233 via the vapor distribution plate 231. The dilution gas can, for example, include an inert gas, such as Ar, or any one of the dilution gases presented above.

The present inventors recognized that substrates being processed in a process chamber can have different emissivity characteristics due to different surface geometries and/or different material characteristics between different substrates. These different emissivity characteristics can cause different radiative exchange between individual substrates and interior surfaces of the process chamber, which leads to variation in process results for the substrates even when the substrates are processed using the same process recipe.

According to an embodiment, at least one internal apparatus surface of the process chamber, including vapor distribution system 230, in contact with processing zone 233 and in radiative communication with a substrate is configured to provide a low emissivity and/or high reflectivity. The emissivity of a material is equivalent to the ratio of the energy radiated by the material to the energy radiated by a blackbody at the same temperature. The emissivity can be influenced by several variables including, but not limited to, the temperature of the emitting body, the material composition of the emitting body and the spectral dependence of the surface emissivity, the surface finish or roughness of the emitting body, material impurities on the surface of the radiating body, etc.

Figure 4:
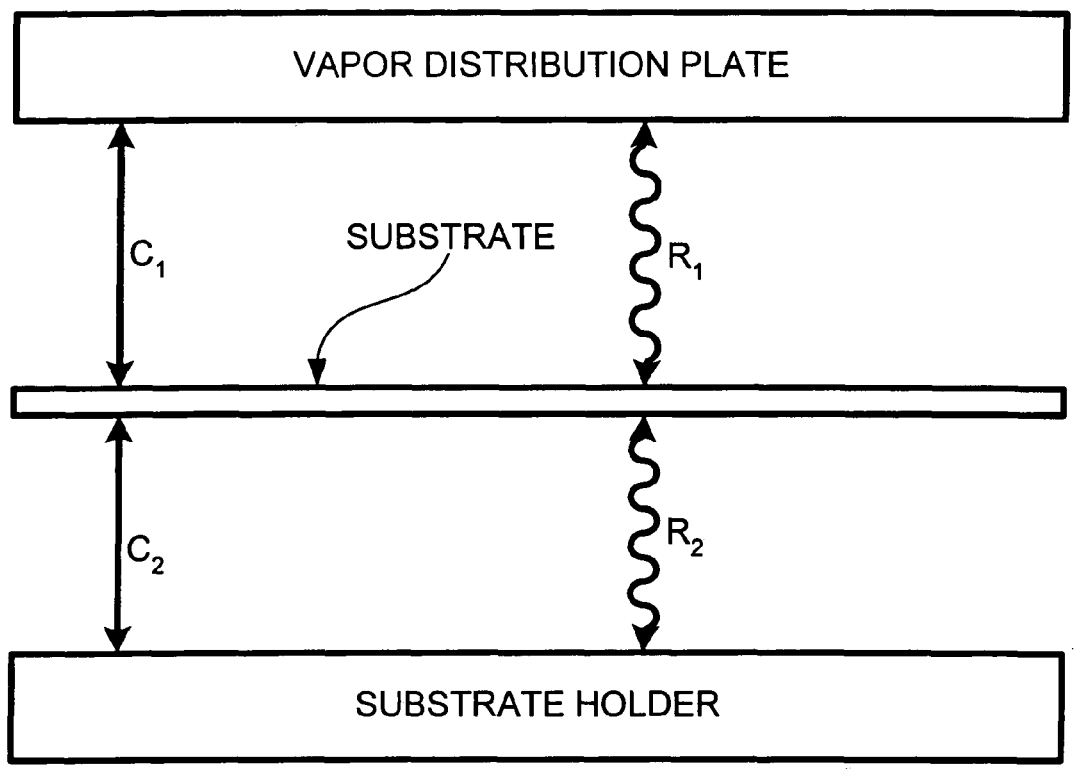
FIG. 4 illustrates the radiative and conductive thermal exchange between a substrate and the surrounding environment in a thin film deposition system.

For example, the at least one apparatus surface can include the lower surface 239 of vapor distribution plate 231. FIG. 4 provides an illustration of the conductive and radiative exchange between a substrate and the substrate holder (upon which the substrate rests), and between the substrate and the vapor distribution plate (which opposes the substrate). Each of the conductive and radiative interactions between the substrate and its surroundings (i.e., the substrate holder and the vapor distribution plate) are described below.

The radiative exchange between the substrate and substrate holder (shown as $R_2$ in FIG. 4) may be expressed as:

$$q_{r,1} = \sigma(T^4_{SH} - T^4_S)/(\in^{-1}_{SH} + \in^{-1}_S - 1), \quad (1)$$

where σ represents the Stefan-Boltzmann constant, $T_{SH}$ represents the substrate holder temperature, $T_S$ represents the substrate temperature, $\in_{SH}$ represents the effective emissivity of the substrate holder, and $\in_S$ represents the effective emissivity of the substrate.

The radiative exchange between the substrate and vapor distribution plate (shown as $R_1$ in FIG. 4) may be expressed as:

$$q_{r,2} = \sigma(T^4_S - T^4_{VDP})/(\in^{-1}_S + \in^{-1}_{VDP} - 1) \quad (2)$$

where $T_{VDP}$ represents the vapor distribution plate temperature, and $\in_{VDP}$ represents the effective emissivity of the substrate.

The conductive exchange between the substrate and substrate holder (shown as $C_2$ in FIG. 4) may be expressed as:

$$q_{c,1} = (k_{eff,1}/d_1)(T_{SH} - T_S), \quad (3)$$

where $d_1$ represents the spacing between the substrate holder and the substrate, and $k_{eff,1}$ represents the effective thermal conductivity of the gas between the substrate holder and the substrate (e.g., $k_{eff,1} \sim k_1/(1+C_1\lambda_1/d_1)$), where $\lambda_1$ is the mean free path for the gas residing between the substrate holder and the substrate, $k_1$ is the thermal conductivity of the gas at atmospheric conditions, and $C_1$ is a relationship that can be determined from Denpoh, K. (1998) IEEE Trans. Semiconductor Mfg., entitled "Modeling of rarefied gas heat conduction between wafer and susceptor").

The conductive exchange between the substrate and vapor distribution plate (shown as $C_1$ in FIG. 4) may be expressed as:

$$q_{c,2} = (k_{eff,2}/d_2)(T_S T_{VDP}), \quad (3)$$

where $d_2$ represents the spacing between the substrate and the vapor distribution plate, and $k_{eff,2}$ represents the effective thermal conductivity of the gas between the substrate and the vapor distribution plate (e.g., $k_{eff,2} \sim k_2/(1+C_2\lambda_2/d_2)$, where $\lambda_2$ is the mean free path for the gas residing between the substrate and the vapor distribution plate, $k_2$ is the thermal conductivity of the gas at atmospheric conditions, and $C_2$ is a relationship that can be determined from Denpoh, K. (1998) IEEE Trans. Semiconductor Mfg., entitled "Modeling of rarefied gas heat conduction between wafer and susceptor").

Using the model expressions for conductive and radiative interactions between the substrate and its surrounding environment as provided above, the inventor has observed that apparatus surfaces in radiative communication with the substrate and configured to be less emissive and/or more reflective tend to reduce the temperature variability between substrates processed in the process chamber. This is especially true for surfaces not having the purpose of controlling and/or adjusting the temperature of the substrate. In a deposition process, temperature variability can, for instance, affect variations in the deposition rate and/or film properties of the resultant film. Thus, embodiments of the present invention can improve uniformity of processing wafer to wafer and/or uniformity within wafer.

Figure 5A:
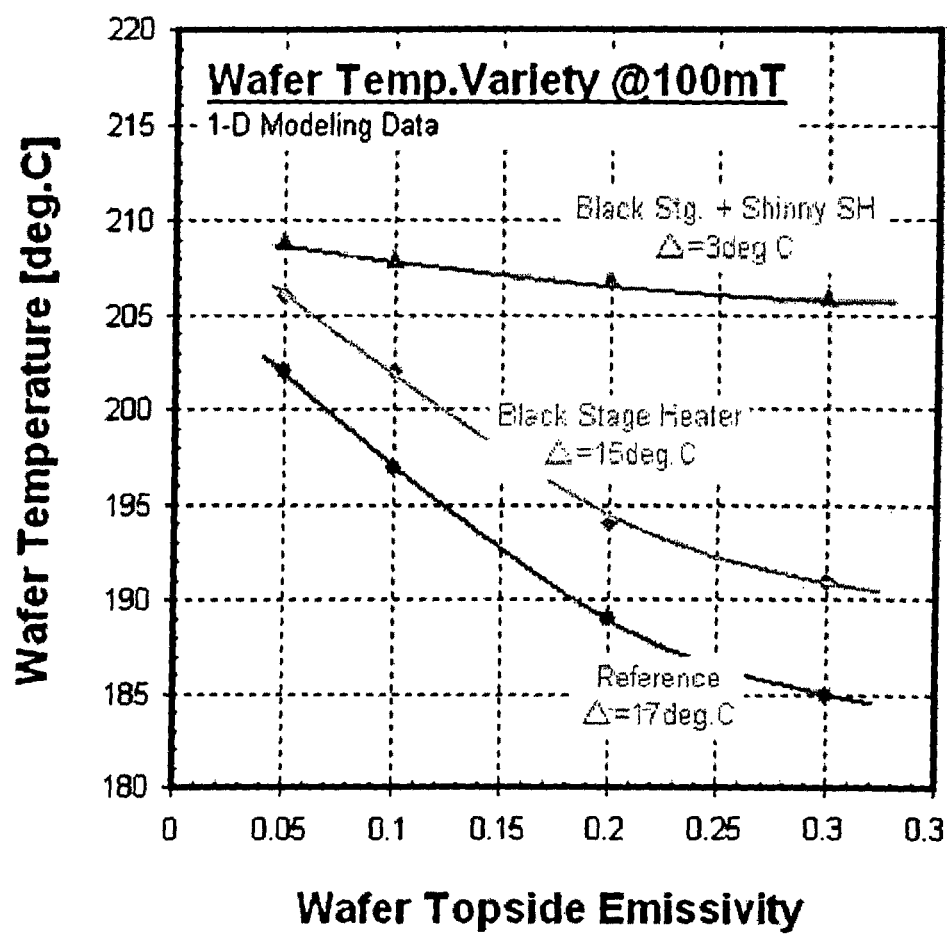
FIGS. 5A and 5B provide exemplary data illustrating the relationship between substrate temperature variability on the radiative properties of its surrounding environment.
Figure 5B:
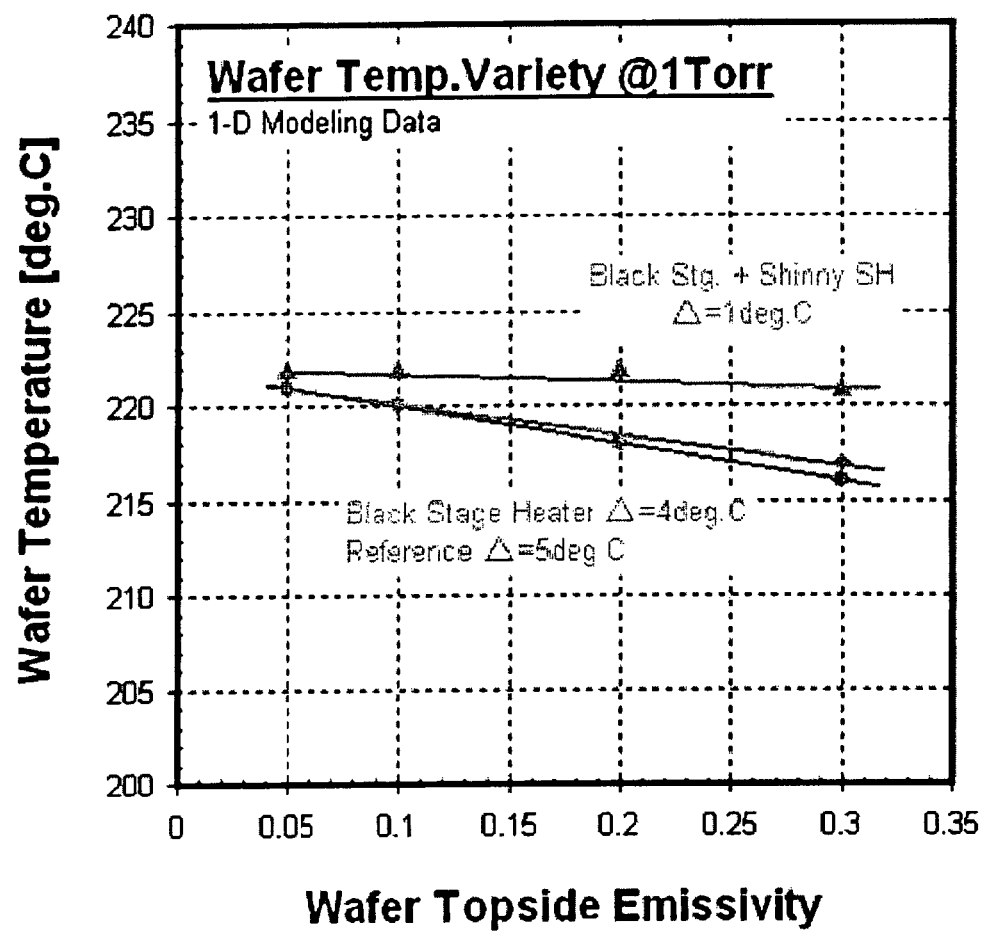

According to the model expressions above, the dependence of the substrate temperature (or wafer temperature) for different substrates (i.e., different emissivities associated with differences in material composition and/or surface morphology) was determined, according to the model expressions above, for variations in the emissivity of both the substrate holder and the vapor distribution plate. For each calculation, the temperature of the substrate holder was set to 227° C. and the temperature of the vapor distribution plate was set to 80° C. FIGS. 5A and 5B, and Table 1 present the substrate temperatures for four (4) different substrates having different emissivity values ($\epsilon_S$=0.05, 0.1, 0.2, and 0.3).

In Table 1, the reference condition sets the emissivity of the substrate holder ($\epsilon_{SH}$) to a value of 0.3 and the emissivity of the vapor distribution plate ($\epsilon_{VDP}$) to a value of 0.3. At a pressure of 100 mTorr (milliTorr) (pressure between substrate and substrate holder, and between substrate and vapor distribution plate), the substrate temperature ranges among the 4 substrates from 185° C. ($\epsilon_S$=0.3) to 202° C. ($\epsilon_S$=0.05), or $\Delta T$=17° C. At a pressure of 1 Torr (pressure between substrate and substrate holder, and between substrate and vapor distribution plate), the substrate temperature among the 4 substrates ranges from 216° C. ($\epsilon_S$=0.3) to 221° C. ($\epsilon_S$=0.05), or $\Delta T$=5° C. As the gas pressure increases, the temperature variability decreases (due, in part, to greater thermal conduction between the substrate and substrate holder). Thus, embodiments of the present invention can generally provide greater benefits for low pressure processes such as a metal deposition process as described herein.

Additionally, in Table 1, an emissive substrate holder condition sets the emissivity of the substrate holder ($\epsilon_{SH}$) to a value of 1 and the emissivity of the vapor distribution plate ($\epsilon_{VDP}$) to a value of 0.3. At a pressure of 100 mTorr (millitorr) (pressure between substrate and substrate holder, and between substrate and vapor distribution plate), the substrate temperature ranges from 191° C. ($\epsilon_S$=0.3) to 206° C. ($\epsilon_S$=0.05), or $\Delta T$=15° C. among the 4 substrates. At a pressure of 1 Torr (pressure between substrate and substrate holder, and between substrate and vapor distribution plate), the substrate temperature ranges from 217° C. ($\epsilon_S$=0.3) to 221° C. ($\epsilon_S$=0.05), or $\Delta T$=4° C. among the 4 substrates. Thus, the present inventor discovered that as the emissivity of the substrate holder ($\epsilon_{SH}$) increases (from a value of 0.3 to 1), the temperature variability decreases marginally. Moreover, the increase in emissivity of the substrate holder may affect a greater reduction in temperature variability at even higher temperatures where radiative transport is more significant.

TABLE 1

| Hardware Configuration | Emissivity | | | p = 100 mTorr | | p = 1 mTorr | |
| --- | --- | --- | --- | --- | --- | --- | --- |
| | Substrate holder | Gas distribution plate | Substrate | Substrate Temp. (deg. C.) | ΔT (deg. C.) | Substrate Temp. | ΔT (deg. C.) |
| Reference | 0.3 | 0.3 | 0.05 | 202 | 17 | 221 | 5 |
| | 0.3 | 0.3 | 0.1 | 197 | | 220 | |
| | 0.3 | 0.3 | 0.2 | 189 | | 218 | |
| | 0.3 | 0.3 | 0.3 | 185 | | 216 | |
| Emissive substrate holder | 1 | 0.3 | 0.05 | 206 | 15 | 221 | 4 |
| | 1 | 0.3 | 0.1 | 202 | | 220 | |
| | 1 | 0.3 | 0.2 | 194 | | 218 | |
| | 1 | 0.3 | 0.3 | 191 | | 217 | |
| Reflective gas distribution plate | 1 | 0.05 | 0.05 | 209 | 3 | 222 | 1 |
| | 1 | 0.05 | 0.1 | 208 | | 222 | |
| | 1 | 0.05 | 0.2 | 207 | | 222 | |
| | 1 | 0.05 | 0.3 | 206 | | 221 | |

Furthermore, in Table 1, a reflective vapor distribution plate condition sets the emissivity of the substrate holder ($\epsilon_{SH}$) to a value of 1 and the emissivity of the vapor distribution plate ($\epsilon_{VDP}$) to a value of 0.05. At a pressure of 100 mtorr (millitorr) (pressure between substrate and substrate holder, and between substrate and vapor distribution plate), the substrate temperature ranges from 206° C. ($\epsilon_S$=0.3) to 209° C. ($\epsilon_S$=0.05), or $\Delta T$=3° C. among the 4 substrates. At a pressure of 1 Torr (pressure between substrate and substrate holder, and between substrate and vapor distribution plate), the substrate temperature ranges from 221° C. ($\epsilon_S$=0.3) to 222° C.

($\in_S$=0.05), or $\Delta T$=1° C. among the 4 substrates. Thus, the inventor also discovered that as the emissivity of the vapor distribution plate ($\in_{VDP}$) decreases (from a value of 0.3 to 0.05), the temperature variability decreases significantly.

The results of the simulation are also shown graphically in FIGS. 5A and 5B.

TABLE 2

| MATERIAL | T (° C.) | EMISSIVITY |
|---|---|---|
| Aluminum, vapor deposited, unoxidized | 25 | 0.02 |
| Aluminum, vapor deposited, unoxidized | 100 | 0.03 |
| Aluminum, vapor deposited, unoxidized | 500 | 0.06 |
| Aluminum, vapor deposited, oxidized | 200 | 0.11 |
| Aluminum, vapor deposited, oxidized | 600 | 0.19 |
| Aluminum, vapor deposited, heavily oxidized | 100 | 0.2 |
| Aluminum, vapor deposited, heavily oxidized | 500 | 0.3 |
| Commercial grade sheet aluminum | 100 | 0.09 |
| Highly polished plate aluminum | 230 | 0.04 |
| Highly polished plate aluminum | 580 | 0.06 |

According to an embodiment, at least one apparatus surface in radiative communication with the substrate is configured to have an emissivity value equal to or less than approximately 0.09. Alternatively, the surface has an emissivity value equal to or less than approximately 0.06. Alternatively yet, the surface has an emissivity value equal to or less than approximately 0.04.

According to another embodiment, at least one apparatus surface in radiative communication with the substrate is configured to have an emissivity value equal to or less than approximately 0.09 at 100 degrees C. Alternatively, the surface has an emissivity value equal to or less than approximately 0.06 at 100 degrees C. Alternatively yet, the surface has an emissivity value equal to or less than approximately 0.04 at 100 degrees C.

The at least one apparatus surface can be configured to provide the above-described emissivity values by use of material compositions having low emissivity, by processing the surface to reduce emissivity or by any other known technique for reducing emissivity of the apparatus.

According to one embodiment, the material composition of the at least one apparatus surface may comprise a metal or metal alloy. The at least one apparatus surface may comprise aluminum or aluminum alloy. For example, as provided in Table 2, aluminum that is vapor deposited on a substrate can have an emissivity ranging from approximately 0.02 at about 25° C. to approximately 0.06 at about 500° C. However, once the aluminum layer is exposed to the atmosphere, a natural layer of aluminum oxide forms causing an increase in the emissivity. For instance, the emissivity for oxidized aluminum is approximately 0.11 at about 200° C. and approximately 0.19 at about 600° C. When the surface is more heavily oxidized, the emissivity increases, e.g., approximately 0.2 at about 100° C. and approximately 0.3 at about 500° C. Furthermore, anodized aluminum conventionally used for apparatus surfaces in radiative communication with the substrate will typically have a high emissivity value. Commercial grade sheet aluminum, which is not heavily oxidized, can have an emissivity of approximately 0.09 at about 100° C., while the emissivity decrease significantly when the surface is polished, i.e., highly polished aluminum can have an emissivity of approximately 0.04 at about 230° C. and approximately 0.06 at about 580° C. An apparatus surface on an aluminum apparatus with a standard machine finish and native oxide is expected to have an emissivity of approximately 0.09 to 0.1 at approximately 100° C.

According to yet another embodiment, the material composition of the at least one apparatus surface may comprise aluminum or aluminum alloy having a polished finish. The degree of polishing can be characterized by a surface roughness, such as a maximum roughness (Rmax), an average roughness (Ra), or a root-mean-square (rms) roughness (Rq). For example, the maximum roughness for a polished finish can be less than approximately 25 microns. Alternately, the maximum roughness can be less than approximately 5 microns. Alternately, the maximum roughness can be less than approximately 2 microns. Alternatively, the maximum roughness can be less than approximately 1 micron. Alternatively yet, the maximum roughness can be less than approximately 0.5 micron. Additionally, for example, a mirror-finish can be achieved with a metal surface, such as an aluminum surface, using an organic mechanical chemical polishing (OMCP) process.

Figure 6:
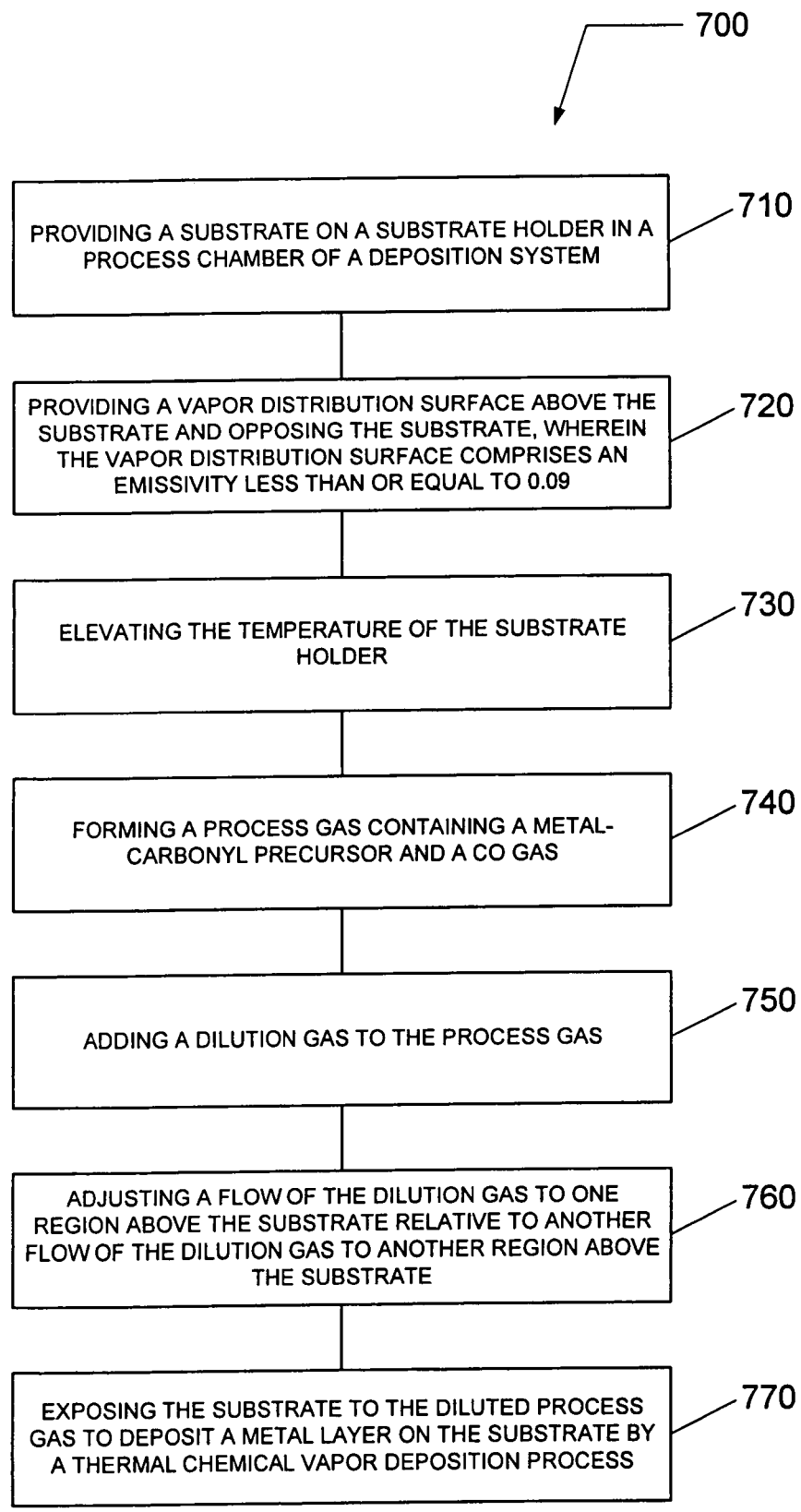
FIG. 6 illustrates a method of depositing a thin film on a substrate according to yet another embodiment.

FIG. 6 illustrates a method of depositing a metal layer on a substrate according to another embodiment. The method 700 includes, at 710, providing a substrate in a process chamber of a deposition system. For example, the deposition system can include the deposition systems described above in FIGS. 1 and 2. The substrate can, for example, be a Si substrate. A Si substrate can be of n- or p-type, depending on the type of device being formed. The substrate can be of any size, for example a 200 mm substrate, a 300 mm substrate, or an even larger substrate. According to an embodiment of the invention, the substrate can be a patterned substrate containing one or more vias or trenches, or combinations thereof. At 720, an apparatus surface, such as a vapor distribution surface located above the substrate and opposing the substrate, is disposed in the deposition system, wherein the vapor distribution surface comprises an emissivity less than or equal to 0.09. All or a portion of the vapor distribution surface can have the same low emissivity value according to the invention. Further, surfaces that are strongly coupled (radiatively) to the substrate can be selected and configured to have a low emissivity according to embodiments of the invention. At 730, the temperature of the substrate holder is elevated to a temperature not to exceed approximately 500° C.

At 740, a process gas containing a metal carbonyl precursor vapor and a CO gas is formed. The process gas can further contain an inert carrier gas. As described above, according to one embodiment, the metal carbonyl precursor can be a ruthenium carbonyl precursor, for example $Ru_3(CO)_{12}$. Addition of the CO gas to the metal carbonyl precursor vapor allows for increasing the vaporization temperature of the metal carbonyl precursor. The elevated temperature increases the vapor pressure of the metal carbonyl precursor, resulting in increased delivery of the metal carbonyl precursor to the process chamber and, hence, increased deposition rate of the metal on a substrate.

The process gas can be formed by heating a metal carbonyl precursor to form the metal carbonyl precursor vapor, and mixing the CO gas with the metal carbonyl precursor vapor. The CO gas can be mixed with the metal carbonyl precursor vapor downstream from the metal carbonyl precursor, for example, in the vapor precursor delivery system 40 or 140. Alternatively, the CO gas can be mixed with the metal carbonyl precursor vapor by flowing the CO gas over or through the metal carbonyl precursor, for example, in the metal precursor vaporization system 50 or 150. Alternatively yet, the process gas can be formed by additionally flowing an inert carrier gas over or through the metal carbonyl precursor.

At 750, a dilution gas may be added to the process gas downstream of the vapor delivery system, and more specifically, in the process chamber and/or the vapor distribution system, to form a diluted process gas. As described in FIGS. 1 and 2, the dilution gas can be added to the process gas in a vapor distribution plenum before the process gas passes through a vapor distribution plate into a processing zone above the substrate. Alternately, the dilution gas can be added to the process gas in the processing zone above the substrate after the process gas flows through the vapor distribution plate. Still alternately, the dilution gas can be added to the process gas in the vapor distribution plate.

At 760, which may coincide with 750, the dilution gas may be introduced to the process gas in such a way that the concentration of dilution gas at one region above the substrate can be adjusted to be different than the concentration of dilution gas at another region above the substrate. In one example, the flow of dilution gas to a central region of the substrate can be different than the flow of dilution gas to a peripheral region of the substrate. In another example, the flow of dilution gas exists only to the peripheral region of the substrate, while there exists no flow of dilution gas to the central region of the substrate. Adjusting the relative dilution of process gas at the center of the substrate relative to the peripheral region of the substrate can facilitate tailoring the film properties of the thin film across the substrate.

At 770, the substrate is exposed to the diluted or non-diluted process gas to deposit a metal layer on the substrate by a thermal chemical vapor deposition process. The metal layer can be deposited at a substrate temperature between about 50° C. and about 500° C. Alternately, the substrate temperature can be between about 300° C. and about 400° C.

As would be appreciated by those skilled in the art, each of the steps or stages in the flowchart of FIG. 6 may encompass one or more separate steps and/or operations. Accordingly, the recitation of only seven steps in 710, 720, 730, 740, 750, 760, and 770 should not be understood to limit the method of the present invention solely to seven steps or stages. Moreover, each representative step or stage 710, 720, 730, 740, 750, 760, 770 should not be understood to be limited to only a single process. Still further, the invention is not limited to the deposition process of FIG. 6. Specifically, the inventive method of providing a low emissivity surface can be applied to any wafer processing wherein a reduction in emissivity of internal surfaces can reduce process variations wafer to wafer or reduce within wafer variations.

Figure 7A:
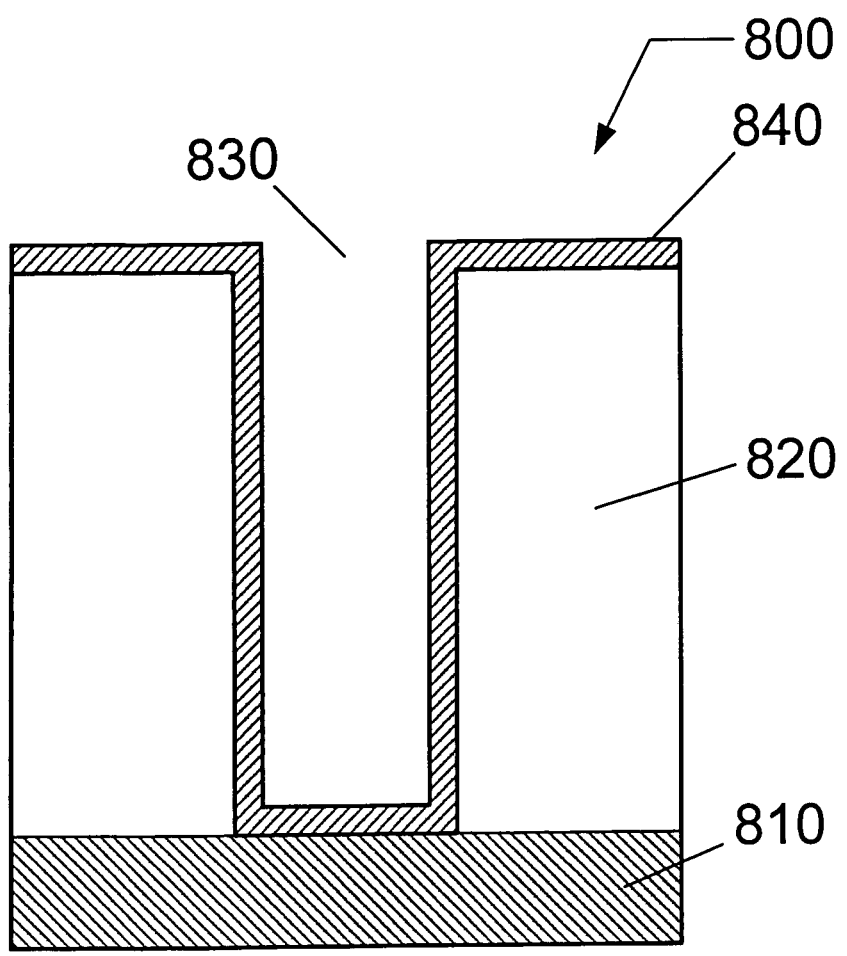
FIGS. 7A through 7C schematically show, in cross-sectional views, formation of a metal layer on a patterned substrate according to embodiments of the invention.
Figure 7B:
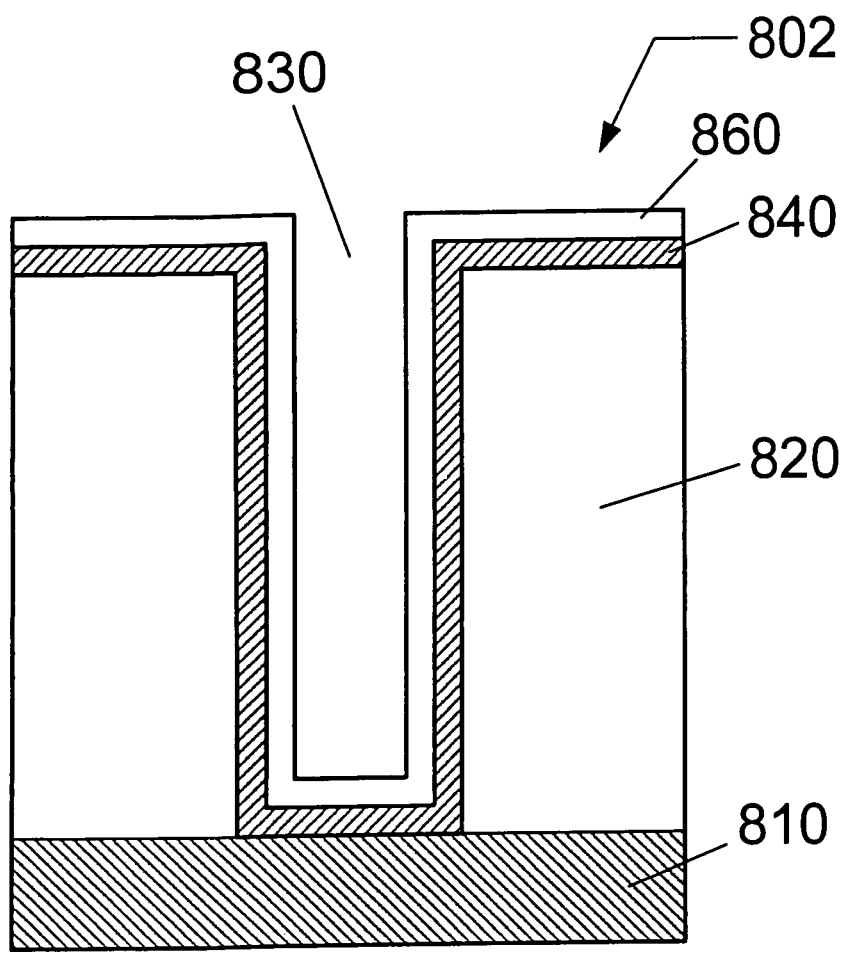
Figure 7C:
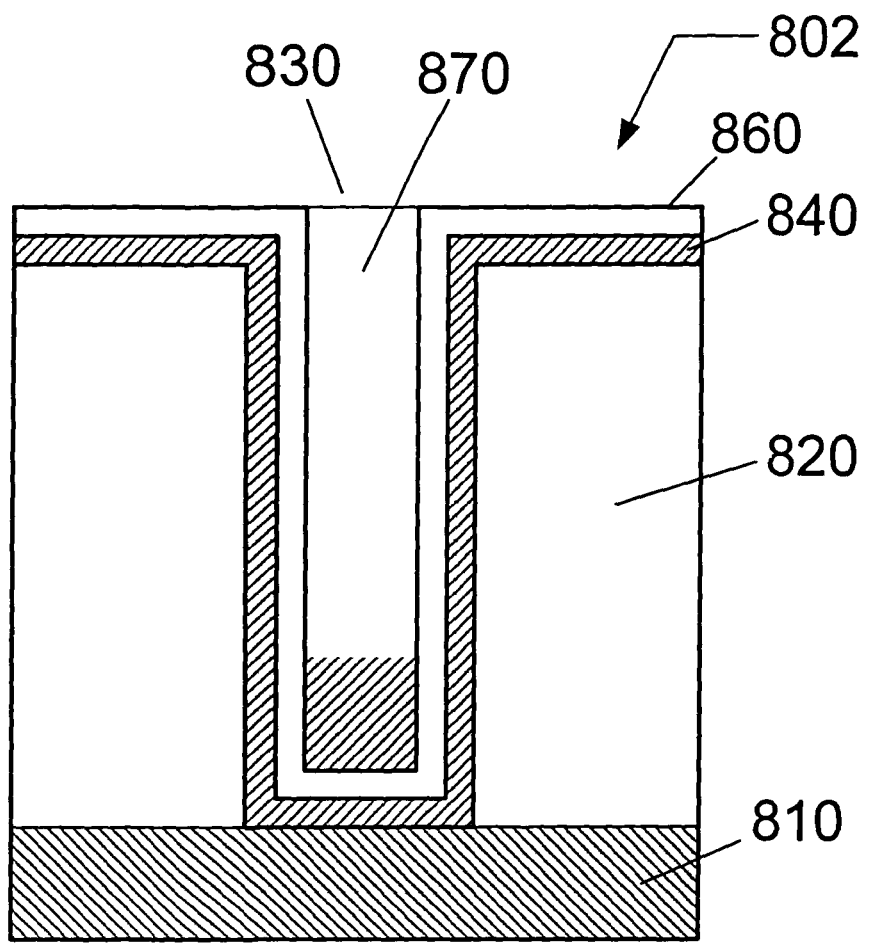

FIGS. 7A-7C schematically show formation of a metal layer on a patterned substrate according to embodiments of the invention. As those skilled in the art will readily appreciate, embodiments of the invention can be applied to patterned substrates containing one or more vias or trenches, or combinations thereof. FIG. 7A schematically shows deposition of a metal layer 840 onto a patterned structure 800 according to an embodiment of the invention. The patterned structure 800 contains a first metal layer 810, and a patterned layer 820 containing an opening 830. The patterned layer 820 can, for example, be a dielectric material. The opening 830 can, for example, be a via or a trench, and the metal layer 840 can, for example, contain Ru metal.

FIG. 7B schematically shows deposition of a metal layer 860 onto a patterned structure 802 according to another embodiment of the invention. The patterned structure 802 contains a first metal layer 810 and a patterned layer 820 containing an opening 830. A barrier layer 840 is deposited onto the patterned structure 802, and a metal layer 860 is deposited on the barrier layer 840. The barrier layer 840 can, for example, contain a tantalum-containing material (e.g., Ta, TaN, or TaCN, or a combination of two or more thereof) or a tungsten material (e.g., W, WN). The patterned layer 820 can, for example, be a dielectric material. The opening 830 can, for example, be a via or a trench, and the metal layer 860 can, for example, contain Ru metal. FIG. 7C schematically shows deposition of Cu 870 in the opening 830 of FIG. 7B.

The metal layers 840 and 860 may be deposited, as described above, using a process gas comprising a metal carbonyl precursor, for example a ruthenium carbonyl, and carbon monoxide (CO). The process chamber is configured to provide one or more surfaces in radiative communication with the substrate having low emissivity (or high reflectivity) in order to reduce the temperature variability between substrates when forming metal layers 840 and 860 on patterned structures 800 and 802. Additionally, a dilution gas may be mixed with the process gas downstream of the vapor delivery system to reduce CO poisoning. For example, the mixing may occur in a process space above the substrate in the process chamber; in a plenum of a vapor distribution system coupled to or within the process chamber; or within a vapor distribution plate of a vapor distribution system coupled to or within the process chamber, where the plate is configured to deliver the process gas from a plenum to a process space above the substrate in the process chamber. Further, the dilution gas may be mixed with the process gas only in a peripheral region of the process space, plenum, or distribution plate, or at a greater concentration in the peripheral region relative to a central region, to reduce CO poisoning at the peripheral edges (not shown) of patterned structures 800 and 802.

One embodiment is a method of depositing a metal layer on a substrate. The method includes providing a substrate on a substrate holder in a process chamber of a deposition system and providing a process chamber comprising one or more internal apparatus surfaces in radiative communication with the substrate having low emissivity (or high reflectivity) in order to reduce the temperature variability between substrates when forming metal layers. The temperature of the substrate holder is then elevated to heat the substrate. The method also includes forming a process gas containing a metal carbonyl precursor vapor and a CO gas and then introducing the process gas into the process chamber. The heated substrate is then exposed to the process gas to deposit a metal layer on the substrate by a vapor deposition process.

In a further embodiment, the method includes adding a dilution gas to the process gas in the process chamber to form a diluted process gas and exposing the substrate to the diluted process gas to deposit the metal layer on the substrate. The distribution of the diluted process gas above the substrate can be adjusted to expose a first region of the substrate to the diluted process gas having a first concentration and to expose a second region of the substrate to the diluted process gas having a second concentration different than the first concentration. For example, the first region can be a peripheral edge region and the second region can be a central region, wherein the first concentration contains a higher amount of the dilution gas than the second concentration.

In the method described above, the process gas may be formed by heating a metal carbonyl precursor in a vaporization system to vaporize the precursor and thereby form the metal carbonyl precursor vapor, and then mixing the CO gas with the metal carbonyl precursor vapor downstream from the vaporization system. Alternatively, the process gas may be formed by heating a metal carbonyl precursor in a vaporization system to vaporize the precursor and thereby form the metal carbonyl precursor vapor, and flowing the CO gas over or through the metal carbonyl precursor during the heating thereof, i.e., as the precursor is being vaporized. In either embodiment, the method may further include flowing an inert carrier gas over or through the metal carbonyl precursor during heating thereof. The inert carrier gas can comprise a noble gas, and the flow rate of the inert carrier gas can be between about 0.1 sccm and about 1000 sccm. Similarly, in embodiments of the method, the flow rate of the CO gas can be between about 0.1 sccm and about 1000 sccm, for example, between about 1 sccm and about 100 sccm.

In the method described above, the metal carbonyl precursor vapor can comprise a tungsten carbonyl, a molybdenum carbonyl, a cobalt carbonyl, a rhodium carbonyl, a rhenium carbonyl, a chromium carbonyl, a ruthenium carbonyl, or an osmium carbonyl, or a combination of two or more thereof, for example, the metal carbonyl precursor vapor can comprise $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

In the method described above, the substrate can be maintained at a temperature between about 50° C. and about 500° C. during the exposure to the process gas, for example, between about 300° C. and about 400° C. Alternatively or additionally, the process chamber can be maintained at a pressure between about 0.1 mTorr and about 200 mTorr during the exposure, for example, between about 1 mTorr and about 100 mTorr, or between about 2 mTorr and about 50 mTorr.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A processing system for treating a substrate, comprising:
   a process chamber having a pumping system configured to evacuate said process chamber;
   a substrate holder coupled to said process chamber and configured to support said substrate and heat said substrate;
   a process gas delivery system coupled to said process chamber and configured to introduce a process gas to a process space above an upper surface of said substrate;
   wherein said process chamber comprises one or more apparatus surfaces in radiative communication with said upper surface of said substrate and having an emissivity value equal to or less than approximately 0.09, said one or more apparatus surfaces being configured to reduce temperature variability between substrates processed in said processing chamber.

2. The processing system of claim 1, wherein said one or more surfaces has an emissivity value equal to or less than approximately 0.06.

3. The processing system of claim 1, wherein said one or more surfaces has an emissivity value equal to or less than approximately 0.04.

4. The processing system of claim 1, wherein said one or more surfaces has an emissivity value equal to or less than approximately 0.04 at 100 degrees C.

5. The processing system of claim 1, wherein said processing system comprises a thermal chemical vapor deposition system.

6. The processing system of claim 1, further comprising:
   an upper chamber assembly coupled to said process chamber, said upper chamber assembly comprising a lower surface in contact with said process space and positioned above and opposite of said upper surface of said substrate, said lower surface being one of said one or more apparatus surfaces having an emissivity value equal to or less than approximately 0.09.

7. The processing system of claim 6, wherein said lower surface has an emissivity value equal to or less than approximately 0.06.

8. The processing system of claim 6, wherein said lower surface comprises polished aluminum.

9. The processing system of claim 8, wherein said upper chamber assembly comprises a gas injection plate having said lower surface, said gas injection plate comprising one or more openings through which said process gas flows into said process space.

10. The processing system of claim 6, wherein said process gas delivery system is coupled to said upper chamber assembly and configured to introduce said process gas through said lower surface of said upper chamber assembly to said process space.

11. The processing system of claim 1, wherein said process gas delivery system comprises:
    a metal precursor vaporization system configured to vaporize a metal carbonyl precursor to form a metal carbonyl precursor vapor;
    a vapor distribution system coupled to or within said process chamber and configured to introduce said metal carbonyl precursor vapor to said process space above said substrate;
    a vapor delivery system having a first end coupled to an outlet of said metal precursor vaporization system and a second end coupled to an inlet of said vapor distribution system; and
    a gas supply system coupled to at least one of said metal precursor vaporization system or said vapor delivery system, or both, and configured to supply a CO gas to transport said metal carbonyl precursor vapor in said CO gas to said inlet of said vapor distribution system.

12. The processing system of claim 11, further comprising:
    a dilution gas source coupled to said vapor distribution system or said process chamber, or both, and configured to supply a dilution gas to said metal carbonyl precursor vapor and said CO gas.

13. The processing system of claim 12, wherein said dilution gas comprises an inert gas.

14. The processing system of claim 11, wherein said metal carbonyl precursor comprises $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

15. The processing system according to claim 11, wherein said vapor distribution system comprises:
    a housing having said inlet formed therein; and
    a vapor distribution plate coupled to said housing and configured to face said substrate, the combination of said housing and said vapor distribution plate forming a plenum configured to receive said CO gas and said metal carbonyl precursor vapor from said vapor delivery system through said inlet formed in said housing, wherein said vapor distribution plate comprises a lower surface in contact with said process space and positioned above and opposite of said upper surface of said substrate, said lower surface being one of said one or more apparatus surfaces having an emissivity value equal to or less than approximately 0.09.

16. The processing system of claim 1, wherein the substrate holder is configured to heat the substrate to a substrate temperature between about 50° C. and about 500° C.

17. The processing system of claim 1, wherein said one or more apparatus surfaces has a maximum roughness of less than approximately 5 microns and is polished using an organic mechanical chemical polishing.

18. A thermal chemical vapor deposition (CVD) system configured to form a thin film on a substrate supported therein, said thermal CVD system comprising:
- a process chamber having a pumping system configured to evacuate said process chamber, and having a substrate holder therein configured to support said substrate and heat said substrate;
- a metal precursor vaporization system configured to vaporize a metal carbonyl precursor to form a metal carbonyl precursor vapor comprising $W(CO)_6$, $Ni(CO)_4$, $Mo(CO)_6$, $(CO)_2(CO)_8$, $Rh_4(CO)_{12}$, $Re_2(CO)_{10}$, $Cr(CO)_6$, $Ru_3(CO)_{12}$ or $Os_3(CO)_{12}$, or a combination of two or more thereof;
- a vapor delivery system having a first end coupled to an outlet of said metal precursor vaporization system and a second end coupled to a vapor distribution plate configured to distribute metal carbonyl precursor vapor in said process chamber, said vapor distribution plate having a lower surface in contact with said process space and positioned above and opposite of said upper surface of said substrate, said lower surface having an emissivity value equal to or less than approximately 0.09 so as to reduce temperature variability between substrates processed in a processing chamber of said thermal CVD system;
- a gas supply system coupled to at least one of said metal precursor vaporization system or said vapor delivery system, or both, and configured to supply a CO gas to transport said metal carbonyl precursor vapor in said CO gas to said inlet of said vapor distribution system in order to facilitate delivery of the metal carbonyl precursor vapor to the substrate; and
- a dilution gas source coupled to said vapor distribution system or said process chamber, or both, and configured to supply a dilution gas to said metal carbonyl precursor vapor and said CO gas in order to reduce the partial pressure of carbonyl by products on the substrate.

19. The processing system of claim 18, wherein said lower surface has an emissivity value equal to or less than approximately 0.06.

20. A processing system for treating a substrate, comprising:
- a process chamber having a pumping system configured to evacuate said process chamber;
- a substrate holder coupled to said process chamber and configured to support said substrate and heat said substrate;
- a process gas delivery system coupled to said process chamber and configured to introduce a process gas to a process space above an upper surface of said substrate;
- wherein said process chamber comprises one or more apparatus surfaces in direct radiative communication with said upper surface of said substrate and having a polished metal surface having a maximum roughness of less than approximately 5 microns.

21. The processing system of claim 20, wherein said maximum roughness of said polished metal surface is less than approximately 2 microns.

22. The processing system of claim 21, wherein said maximum roughness of said polished metal surface is less than approximately 1 micron.

23. The processing system of claim 22, wherein said maximum roughness of said polished metal surface is less than approximately 0.5 micron.

24. The processing system of claim 20, wherein said polished metal surface comprises polished aluminum.

25. The processing system of claim 20, further comprising:
- an upper chamber assembly coupled to said process chamber, said upper chamber assembly comprising a lower surface in contact with said process space and positioned above and opposite of said upper surface of said substrate, said lower surface being one of said one or more apparatus surfaces having a polished aluminum surface having a maximum roughness of less than approximately 5 microns.

* * * * *